United States Patent
Suzuki et al.

(10) Patent No.: US 10,937,731 B2
(45) Date of Patent: Mar. 2, 2021

(54) SEMICONDUCTOR MODULE AND METHOD FOR MANUFACTURING SEMICONDUCTOR MODULE

(71) Applicant: Hitachi, Ltd., Tokyo (JP)

(72) Inventors: Tomohisa Suzuki, Tokyo (JP); Takeshi Terasaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/318,194

(22) PCT Filed: Mar. 17, 2017

(86) PCT No.: PCT/JP2017/010990
§ 371 (c)(1),
(2) Date: Jan. 16, 2019

(87) PCT Pub. No.: WO2018/020729
PCT Pub. Date: Feb. 1, 2018

(65) Prior Publication Data
US 2019/0287896 A1    Sep. 19, 2019

(30) Foreign Application Priority Data

Jul. 27, 2016  (JP) .............................. JP2016-147038

(51) Int. Cl.
*H01L 23/522*    (2006.01)
*H01L 23/00*    (2006.01)
(Continued)

(52) U.S. Cl.
CPC .......... *H01L 23/5226* (2013.01); *H01L 23/48* (2013.01); *H01L 24/33* (2013.01);
(Continued)

(58) Field of Classification Search
CPC ....... H01L 25/072; H01L 25/50; H01L 25/18; H01L 24/83; H01L 24/40;
(Continued)

(56) References Cited

U.S. PATENT DOCUMENTS 8,125,080 B2 * 2/2012 Lee ..................... H01L 23/3121
257/724
2005/0123080 A1    6/2005 Narayan et al.
(Continued)

FOREIGN PATENT DOCUMENTS

JP      58-180050 A    10/1983
JP      03-045653 A    2/1991
(Continued)

OTHER PUBLICATIONS

International Search Report of PCT/JP2017/010990 dated May 23, 2017.
(Continued)

*Primary Examiner* — Jasmine J Clark
(74) *Attorney, Agent, or Firm* — Mattingly & Malur, PC (57) ABSTRACT

Provided is a semiconductor module enabling to effectively reduce, with a relatively simple structure, a thermal strain occurring in a bonding section between a semiconductor chip and other conductor members. The semiconductor module is characterized by being provided with: a first wiring layer; a semiconductor element bonded on the first wiring layer via a first bonding layer; a first electrode bonded on the semiconductor element via a second bonding layer; a second electrode connected on the first electrode; and a second wiring layer connected on the second electrode. The semiconductor module is also characterized in that: the width of the second electrode, said width being in the short-side direction, is more than the thickness of the first
(Continued)

electrode; and the second electrode is disposed at a position off the center position of the semiconductor element.

20 Claims, 7 Drawing Sheets (51) Int. Cl.
- *H01L 25/07* (2006.01)
- *H01L 25/00* (2006.01)
- *H01L 29/16* (2006.01)
- *H01L 23/48* (2006.01)
- *H01L 25/18* (2006.01)

(52) U.S. Cl.
CPC ............ *H01L 25/07* (2013.01); *H01L 25/072* (2013.01); *H01L 25/18* (2013.01); *H01L 25/50* (2013.01); *H01L 29/1608* (2013.01)

(58) Field of Classification Search
CPC . H01L 2224/8484; H01L 24/29; H01L 24/33; H01L 23/3735; H01L 23/48; H01L 23/5385; H01L 23/5389; H01L 2224/40499; H01L 2924/01029; H01L 2924/00014; H01L 29/1608; H01L 2224/8384; H01L 23/3677; H01L 24/32; H01L 2224/291; H01L 2224/83801; H01L 23/5226; H01L 25/07
See application file for complete search history.

(56) References Cited

U.S. PATENT DOCUMENTS

| | | |
|---|---|---|
| 2008/0128896 A1 | 6/2008 | Toh et al. |
| 2011/0062600 A1 | 3/2011 | Ueno et al. |
| 2016/0035646 A1 | 2/2016 | Soyano |
| 2017/0154834 A1* | 6/2017 | Tonedachi et al. ..... H01L 24/40 |

FOREIGN PATENT DOCUMENTS

| | | |
|---|---|---|
| JP | 05-050743 A | 3/1993 |
| JP | 2002-110893 A | 4/2002 |
| JP | 2012-238749 A | 12/2012 |
| JP | 2013-140862 A | 7/2013 |
| JP | 2015-142018 A | 8/2015 |
| JP | 2015-230913 A | 12/2015 |

OTHER PUBLICATIONS

Extended European Search Report received in corresponding European Application No. 17833740.8 dated Jan. 24, 2020.

* cited by examiner

SEMICONDUCTOR MODULE AND METHOD FOR MANUFACTURING SEMICONDUCTOR MODULE

TECHNICAL FIELD

The present invention relates to a semiconductor module and a method for manufacturing a semiconductor module, particularly to an effective technique applied to a silicon carbide (SiC) power module.

BACKGROUND ART

Focusing on hybrid vehicles and railway applications, market expansion of power devices used for power control devices such as inverters continues to expand in recent years. With increasing awareness of environmental protection and energy conservation, the power devices are required to be more efficient. However, performance of power devices using silicon (Si) in the related art is approaching a limit, and development of next-generation power devices using silicon carbide (SiC) of higher efficiency is advanced. In the SiC power device, operation can be performed under a high temperature of 200° C. or higher and a substantial reduction in size and weight can be achieved.

However, in a high-temperature environment of 200° C. or higher, lead-free solder used as a related bonding material for chips cannot be used due to a problem of remelting. It is expected that high melting point solder having a lead content of 85% or more and excluded from the Restriction of Hazardous Substances (RoHS) command now will be a target item of the RoHS in the future, and development of alternative materials is urgent. Sintered metal materials obtained by sintering nano-metal particles or micrometer-order metal particles are expected as these alternative materials, and development with regard to bonding with sintered silver or sintered copper is advanced.

The power device is evaluated for durability against thermal stress by a temperature cycle test. In the temperature cycle test, a thermal strain caused by a difference in coefficients of linear expansion between members concentrates mainly on a bonding section of the power device and breaks the bonding section.

In order to efficiently cool the power device, for example, a double-sided cooling structure as shown in PTL 1 is studied. In order to reduce the thermal strain in the bonding section of the power device, for example, a step difference is provided in a heat sink section so as to form a thin section in PTL 2. Further, PTL 3 describes a structure in which a plate-shaped conductor member for inspection is provided on an upper surface of a semiconductor chip.

PRIOR ART LITERATURE

Patent Literature

PTL 1: JP-A-2015-230913
PTL 2: JP-A-2002-110893
PTL 3: JP-A-2012-238749

SUMMARY OF INVENTION

Technical Problem

In operation performed under a high temperature of 200° C. or higher, it is considered that the thermal strain occurring in a bonding member increases and breakage of the bonding member becomes a problem more than ever. PTL 1 relates to a module structure having an enhanced waterproof effect in a water-cooled semiconductor module. However, although cooling efficiency of the entire semiconductor module is improved, the thermal strain occurring locally in the bonding section of the above power device is not taken into consideration.

Further, a method for reducing the strain by providing the thin section at an outer periphery of the heat sink is described in PTL 2. However, a sufficient strain reduction effect cannot be obtained in a case where a high temperature condition of 200° C. or higher is assumed since the heat sink having high rigidity is provided just above a center position of a chip where the temperature is the highest.

In addition, the plate-shaped conductor member as shown in PTL 3 is also considered for connection with the heat sink. However, in this case, heat dissipation property is low and cooling performance is poor since a heat dissipation path is narrow.

Therefore, an object of the invention is to provide a semiconductor module enabling to effectively reduce, with a relatively simple structure, a thermal strain occurring in a bonding section between a semiconductor chip and other conductor members.

Further, another object of the invention is to provide a method, without using a complicated process, for manufacturing a semiconductor module enabling to effectively reduce a thermal strain occurring in a bonding section between a semiconductor chip and other conductor members.

Solution to Problem

In order to solve the above problems, a semiconductor module according to the invention includes: a first wiring layer; a semiconductor element bonded to the first wiring layer via a first bonding layer; a first electrode bonded to the semiconductor element via a second bonding layer; a second electrode connected to the first electrode; and a second wiring layer connected to the second electrode, in which a width of the second electrode, the width being in a short-side direction, is more than a thickness of the first electrode, and the second electrode is disposed at a position off a center position of the semiconductor element.

Furthermore, a method for manufacturing a semiconductor module according to the invention includes: (a) a step of bonding a semiconductor element to a first wiring layer via a first bonding layer; (b) a step of bonding a first electrode to the semiconductor element via a second bonding layer; (c) a step of disposing a second electrode and a spacer on the first electrode; (d) a step of forming a second wiring layer on the second electrode and the spacer; and (e) a step of pressurizing from the second wiring layer, in which a width of the second electrode, the width being in a short-side direction, is more than a thickness of the first electrode, and the second electrode is disposed at a position off a center position of the semiconductor element.

Advantageous Effect

According to the invention, it is possible to provide a semiconductor module enabling to effectively reduce, with a relatively simple structure, a thermal strain occurring in a bonding section between a semiconductor chip and other conductor members.

Further, according to the invention, it is possible to provide a method, without using a complicated process, for manufacturing a semiconductor module enabling to effectively reduce a thermal strain occurring in a bonding section between a semiconductor chip and other conductor members.

Problems, configurations, and effects other than those described above will be clarified by the following description of embodiments.

DESCRIPTION OF EMBODIMENTS

Hereinafter, embodiments according to the invention are described in detail with reference to the drawings. However, the invention is not limited to the embodiments described here and can be appropriately combined and modified within the scope not deviated from the technical spirit of the invention.

Embodiment 1

Figure 1:
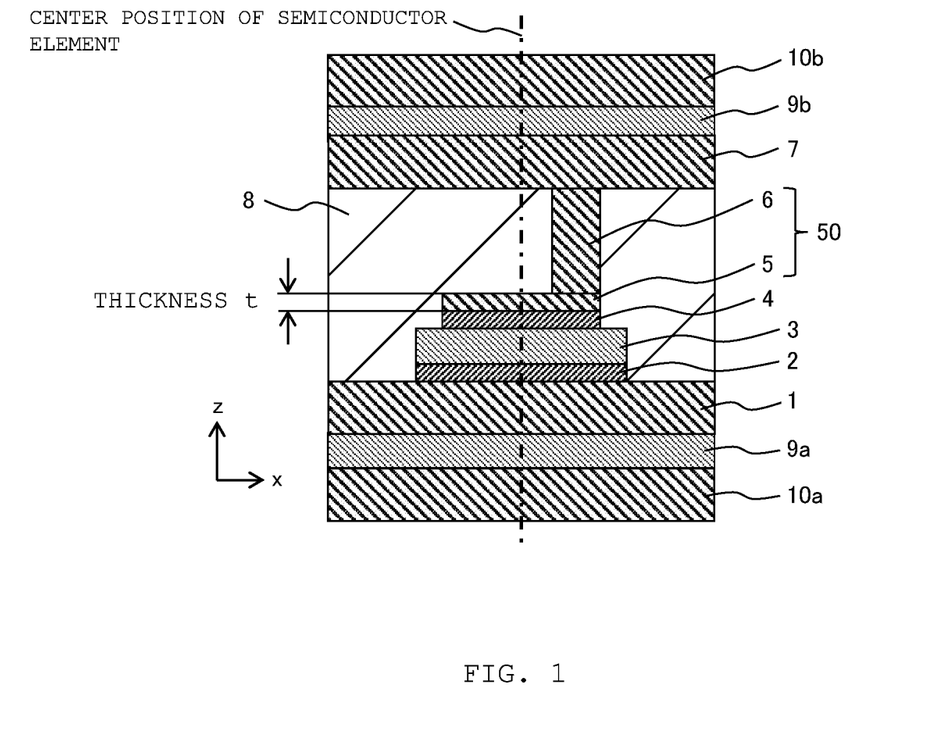
FIG. 1 is a cross-sectional view of a semiconductor module according to an embodiment of the invention.
Figure 2A:
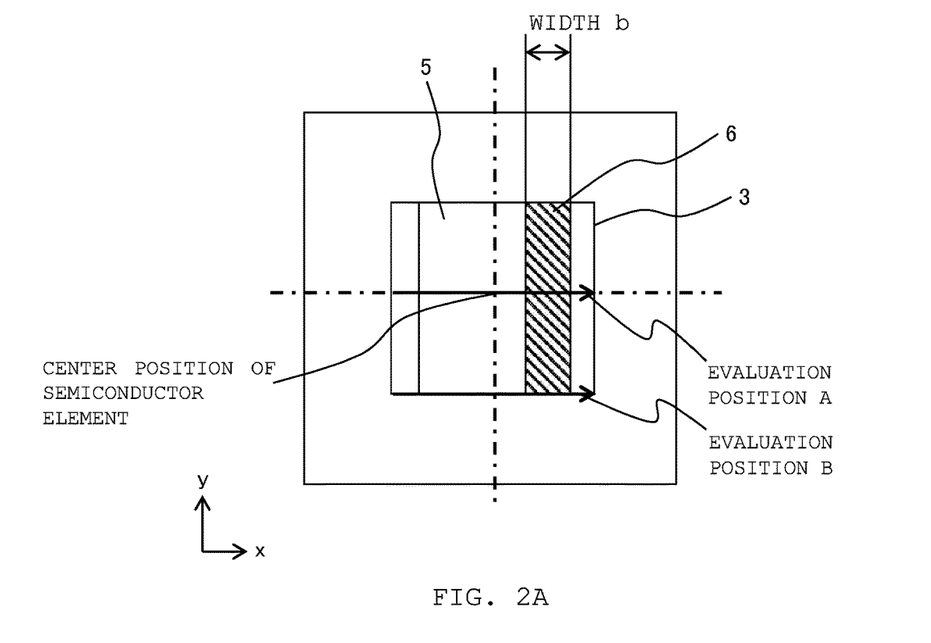
FIG. 2A is a plan view of the semiconductor module according to the embodiment of the invention.
Figure 2B:
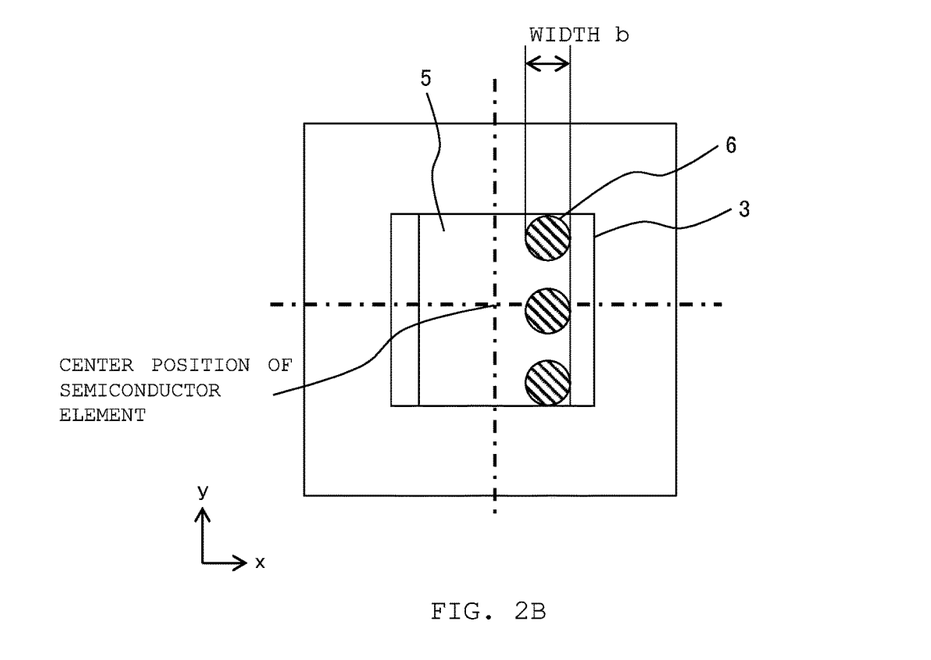
FIG. 2B shows a modification of FIG. 2A.

A semiconductor module according to this embodiment is described with reference to FIGS. 1 to 2B. FIG. 1 is a cross-sectional view of a main part of the double-sided cooling semiconductor module, showing a wiring structure of a semiconductor element 3 mounted between a cooling member 10a at a lower side and a cooling member 10b at an upper side. FIG. 2A is a plan view of the semiconductor module according to FIG. 1 when viewed from the top, showing a positional relationship of the semiconductor element 3, a first electrode 5 and a second electrode 6. Further, FIG. 2B shows a modification of FIG. 2A, showing an example in which the second electrode 6 includes a plurality of vias (here, three vias) in FIG. 2B, while the second electrode 6 according to FIG. 2A has a slit shape.

The semiconductor module according to this embodiment has a layered structure including at least a first wiring layer 1, a first bonding layer 2, the semiconductor element 3, a second bonding layer 4, the first electrode 5, the second electrode 6, and a second wiring layer 7 in order from the lower layer as shown in FIG. 1. An electrode 50 includes the first electrode 5 and the second electrode 6. A gap between the first wiring layer 1 and the second wiring layer 7 is filled and sealed with a sealing member 8. A cooling member 10a is provided at a lower layer (outer side) of the first wiring layer 1 via an insulating member 9a, and a cooling member 10b is provided at an upper layer (outer side) of the second wiring layer 7 via an insulating member 9b.

The first wiring layer 1, the second wiring layer 7, the first electrode 5 and the second electrode 6 are formed of a conductive material such as copper (Cu) or aluminum (Al). The first bonding layer 2 and the second bonding layer 4 are formed of a bonding material such as solder, sintered silver, sintered copper or sintered gold. The semiconductor element 3 is formed of a semiconductor material such as Si, SiC, or gallium nitride (GaN). An insulating material such as sealing resin, ceramic, glass or gas is used for the sealing material 8. The insulating members 9a and 9b are formed of an insulating material such as aluminum nitride (AlN), silicon nitride (SiN), aluminum oxide ($Al_2O_3$) or a resin sheet. The cooling members 10a and 10b are formed of a material having high thermal conductivity such as Al, or Cu.

In a case where the semiconductor module operates at a high temperature, it is preferred that the semiconductor element 3 is a wide band gap semiconductor of SiC or GaN or the like, and the bonding layer is formed of sintered silver or sintered copper having a high melting point and high heat resistance. It is more preferable that the second bonding layer 4 is formed of sintered copper, and the first electrode 5 and the second electrode 6 are formed of Cu since a difference in a coefficient of linear expansion between these members is eliminated and a strain is reduced. Further, it is preferred that the first electrode 5 has a film thickness approximately equal to that of the second bonding layer 4.

As shown in FIGS. 1 and 2A, the second electrode 6 is provided at a position off a center position of the semiconductor element 3. Accordingly, since the second electrode 6 is provided in a manner that avoids the center position where a temperature of the semiconductor element is the highest, an influence of a thermal strain generated by thermal expansion of the second electrode 6 can be prevented.

Figure 3:
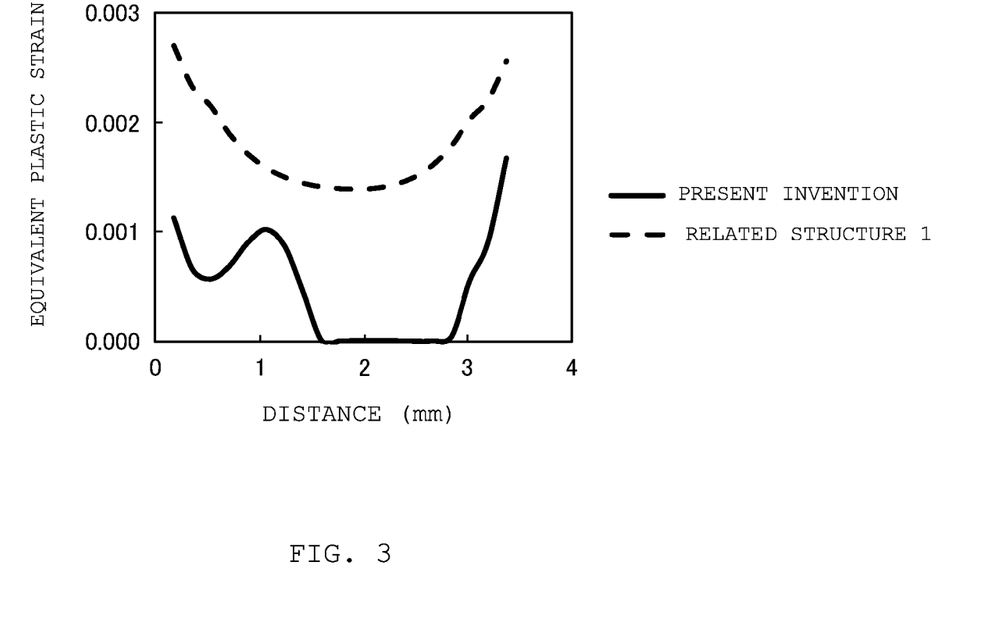
FIG. 3 is a diagram showing a strain reducing effect of the semiconductor module.

FIG. 3 shows a comparison result of a distribution of equivalent plastic strains at an evaluation position B of a structure in which a thin section is provided at a peripheral part as described in PTL 2 and of a structure (FIG. 2A) according to this embodiment, the comparison result being calculated by finite element analysis. In FIG. 3, a horizontal axis indicates a position from a left end of the semiconductor element 3, and a vertical axis indicates strength of the equivalent plastic strain. In a related structure 1 (a structure according to PTL 2), a strain occurs over the entire semiconductor element. Meanwhile, it is understood that a strain is mitigated in the entire structure according to this embodiment (the invention), and particularly there is almost no strain in the vicinity of the center position of the semiconductor element. Accordingly, a strain occurring in the bonding layer can be effectively reduced according to this invention.

It is necessary to set a width b (e.g., first dimension) (FIG. 2A) of the second electrode 6 to be at least larger than a thickness t (FIG. 1) of the first electrode 5. Since the width b of the second electrode 6 is set to be larger than the thickness t of the first electrode 5, a heat dissipation path is widened and heat dissipation property is improved.

Figure 4:
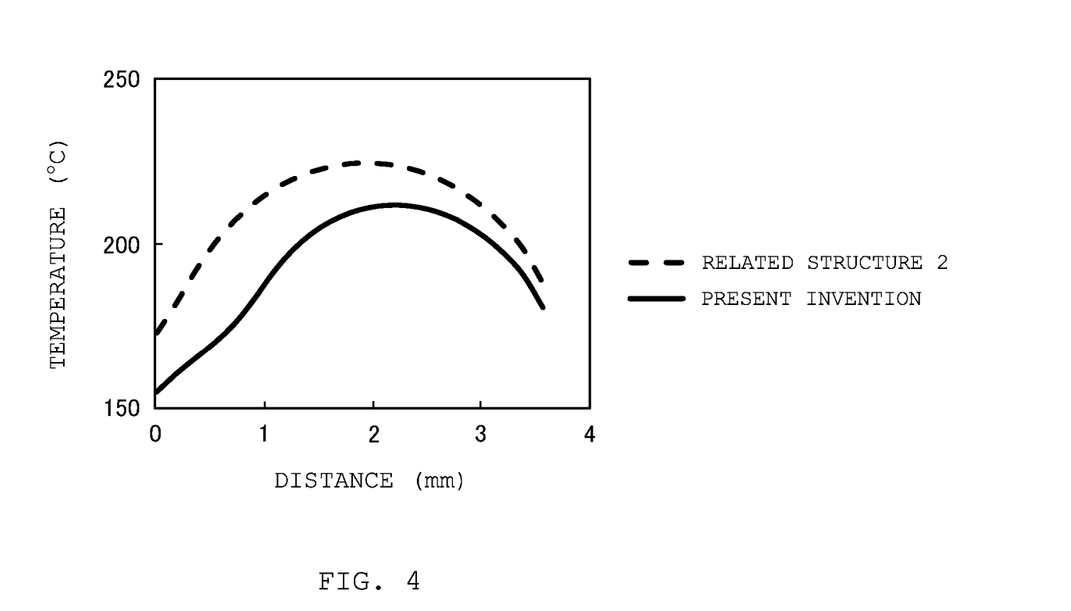
FIG. 4 is a diagram showing a chip temperature of the semiconductor module.

FIG. 4 shows a result of comparing temperatures at an evaluation position A (FIG. 2A) of the semiconductor element 3 in a case where a relationship between a width b of a deformed part of a first conductor member and a thickness t of a bonding section is b=t as in PTL 3 and in a case where a relationship between the width b of the second electrode 6 and the thickness t of the first electrode 5 is b>t as in the structure according to this embodiment. In FIG. 4, a horizontal axis indicates the position from the left end of the semiconductor element 3, and a vertical axis indicates the temperature of the semiconductor element 3. It is understood that the structure according to this embodiment (the invention) has a lower temperature in comparison with a related structure 2 (a structure according to PTL 3). Accordingly, cooling performance of the semiconductor module can be maintained and a strain of a bonding section between the semiconductor element and other semiconductor members can be effectively reduced according to the invention. Therefore, reliability of the semiconductor module can be improved.

Instead of setting the second electrode 6 in the slit shape as shown in FIG. 2A, the plurality of vias may be formed as shown in FIG. 2B. In this case, it is also necessary to set the width b of the second electrode 6, that is, a via diameter b, to be larger than the thickness t (FIG. 1) of the first electrode 5. Further, it is desired that the number of the vias to be provided is determined after the temperature and the strain of the semiconductor element are calculated in advance by simulation or the like.

Embodiment 2

Figure 5:
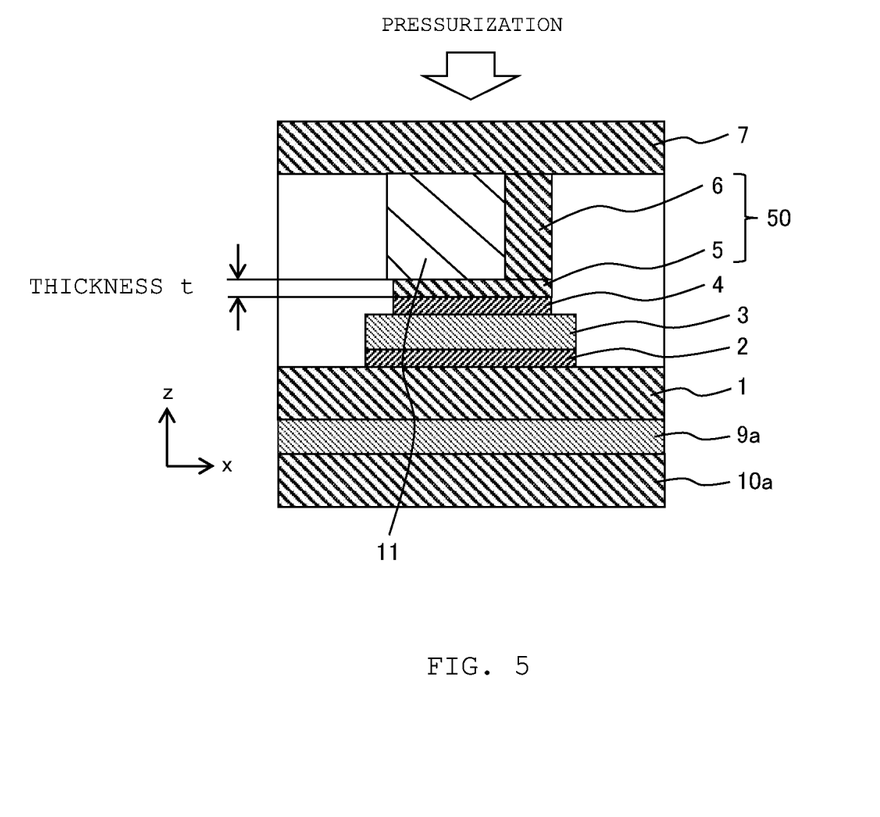
FIG. 5 is a view showing a part of a manufacturing process of the semiconductor module according to the embodiment of the invention.

A method for manufacturing a semiconductor module according to this embodiment is described with reference to FIGS. 1 and 5. In a method for manufacturing the electrode 50 including the first electrode 5 and the second electrode 6, the first electrode 5, the second electrode 6, and the second wiring layer 7 are separately formed, and respective members are connected with each other via a bonding member therebetween. That is, the first electrode 5 and the second electrode 6 are connected via a third bonding layer, and the second electrode 6 and the second wiring layer 7 are connected via a fourth bonding layer.

At this time, it is preferred that the first electrode 5, the second electrode 6, and the second wiring layer 7 are formed of Cu, and the bonding members between the respective members are formed of sintered copper. Even in a case where Cu cannot be used for the second wiring layer 7, it is preferred that at least the first electrode 5 and the second electrode 6 having a high temperature are formed of Cu, and the bonding member therebetween is formed of sintered copper so as to reduce a thermal strain.

In addition, the second wiring layer 7 and the second electrode 6 may be formed as an integrated object by molten metal, cutting or the like. At this time, it is more preferable if the first electrode 5 can also be formed integrally with the second wiring layer 7 and the second electrode 6 since the bonding section is eliminated.

In a case where the members are bonded to each other by sintered metal, a pressurization process is generally required. At this time, in order to apply pressure uniformly, a not bonded spacer 11 may be sandwiched between the first electrode 5 and the second wiring layer 7 as shown in FIG. 5. In this case, the spacer 11 is preferably formed of the same material as the second electrode 6 and is removed after bonding. For example, in a case where the second electrode 6 is formed of Cu, it is desired that Cu is also used for the spacer 11. Since the same material is used, the pressure can be applied uniformly, and highly reliable bonding can be formed between respective members.

The spacer 11 may be formed of the same material as the sealing member 8 and molded as it is. The first wiring layer 1 to the first electrode 5 may be pressure-bonded once, and then the second electrode 6 and the second wiring layer 7 may be pressure-bonded.

Figure 6A:
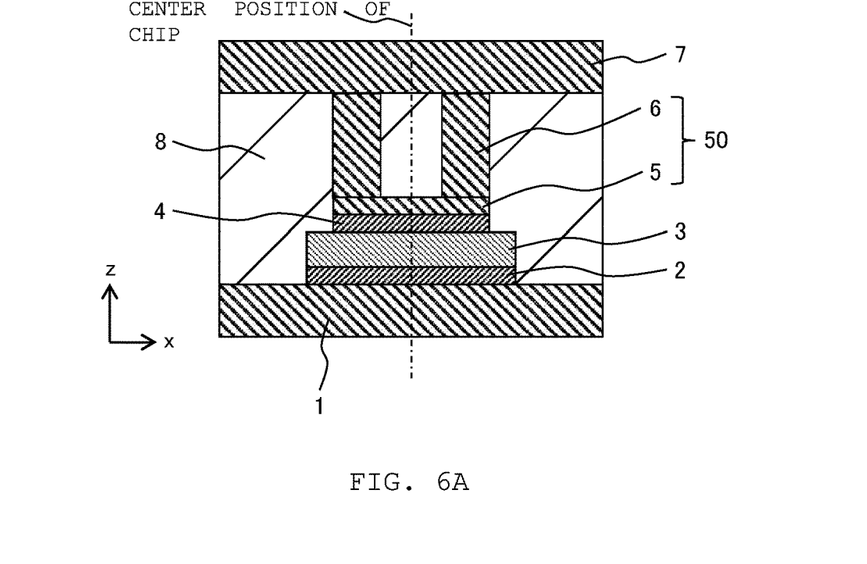
FIG. 6A is a cross-sectional view of a semiconductor module according to an embodiment of the invention.
Figure 6B:
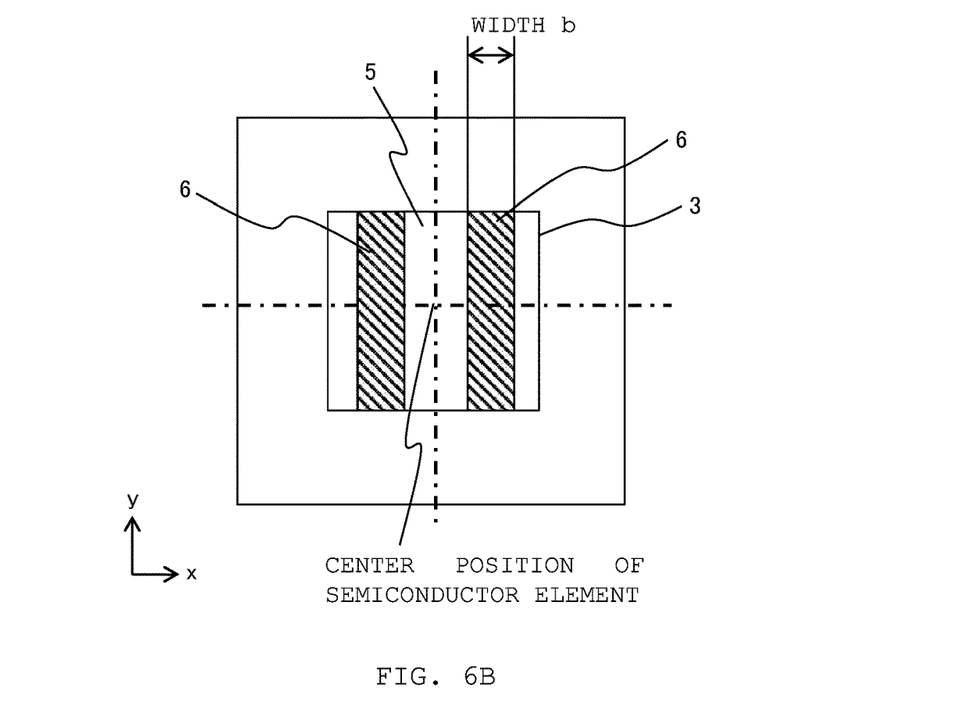
FIG. 6B is a plan view of the semiconductor module according to the embodiment of the invention.

FIGS. 6A and 6B show a modification of the semiconductor module illustrated in FIGS. 1 and 2A. FIG. 6A shows a layered structure from the first wiring layer 1 to the second wiring layer 7. In FIG. 1, the first electrode 5 and the second wiring layer 7 are connected by one second electrode 6, while in FIG. 6A, two second electrodes 6 are provided at both ends of the first electrode 5 with a center position of a chip sandwiched therebetween so as to connect the first electrode 5 and the second wiring layer 7. FIG. 6B is a plan view of FIG. 6A when viewed from the top.

As shown in FIGS. 6A and 6B, since the two second electrodes 6 are provided at both ends of the first electrode 5 with the center position of the chip sandwiched therebetween so as to connect the first electrode 5 and the second wiring layer 7, in a case where the members are bonded to each other by sintered metal, it is possible to more uniformly pressurize the members. In this case, since a heat dissipation path from the first electrode 5 is doubled, the thermal strain can be more effectively reduced.

According to this embodiment, even in a case where a power device using SiC or the like operates at a high temperature, a thermal strain occurring in a sintered metal bonding section can be reduced, and reliability of the bonding can be improved.

Embodiment 3

Figure 7A:
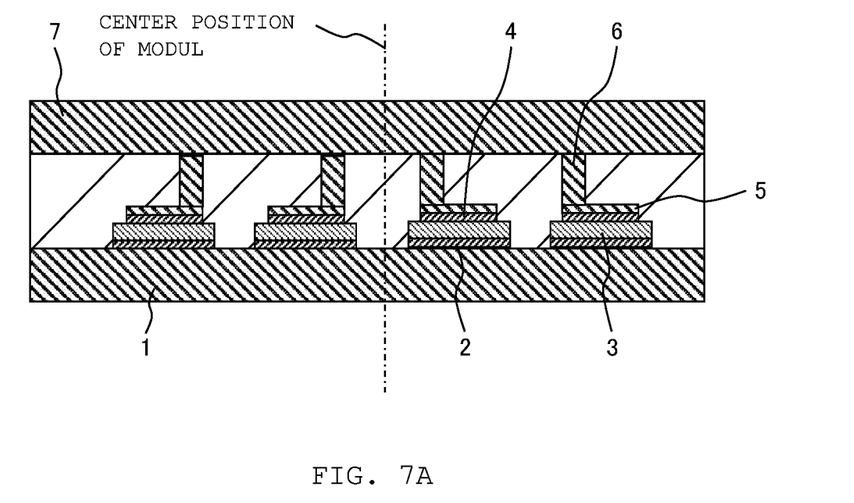
FIG. 7A is a cross-sectional view of a semiconductor module according to an embodiment of the invention.
Figure 7B:
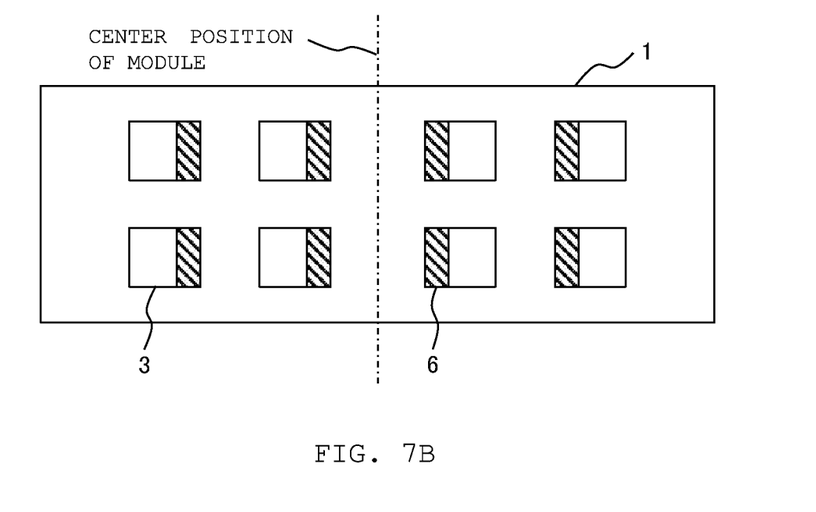
FIG. 7B is a plan view of the semiconductor module according to the embodiment of the invention.

A semiconductor module according to this embodiment is described with reference to FIGS. 7A to 8B. FIG. 7A is a cross-sectional view of the semiconductor module in which a plurality of semiconductor elements 3 are disposed between the first wiring layer 1 and the second wiring layer 7. FIG. 7B is a plan view of FIG. 7A when viewed from the top. Further, FIGS. 8A and 8B show a modification of FIGS. 7A and 7B, illustrating an example in which positions of respective second electrodes 6 with respect to respective semiconductor elements 3 are different.

In the semiconductor module of FIGS. 7A and 7B, the second electrodes 6 on the semiconductor elements 3 disposed in left and right regions of a center position of the module are disposed so as to be symmetrical with respect to the center position of the module. Further, in the semiconductor module of FIGS. 8A and 8B, the second electrodes 6 on the semiconductor elements 3 separately disposed in the left and right regions of the center position of the module are disposed so as to be symmetrical in the same regions.

In a case where SiC is used for a semiconductor element, a chip (the semiconductor device) cannot be enlarged due to a defect problem of the element. Therefore, in general, as shown in FIGS. 7A to 8B, a plurality of chips are connected in parallel for use in many cases. At this time, the first electrode 5 and the second electrode 6 have a structure as described in the first embodiment and the second embodiment to increase the heat dissipation property, and in addition, the second electrodes 6 are disposed symmetrically with respect to the center position of the semiconductor module as shown in FIGS. 7A to 8B to reduce an uneven distribution of thermal strains in the semiconductor module, so that a deviation of curvature deformation of the entire semiconductor module can be prevented. Accordingly, reliability of the semiconductor module is improved.

Figure 8A:
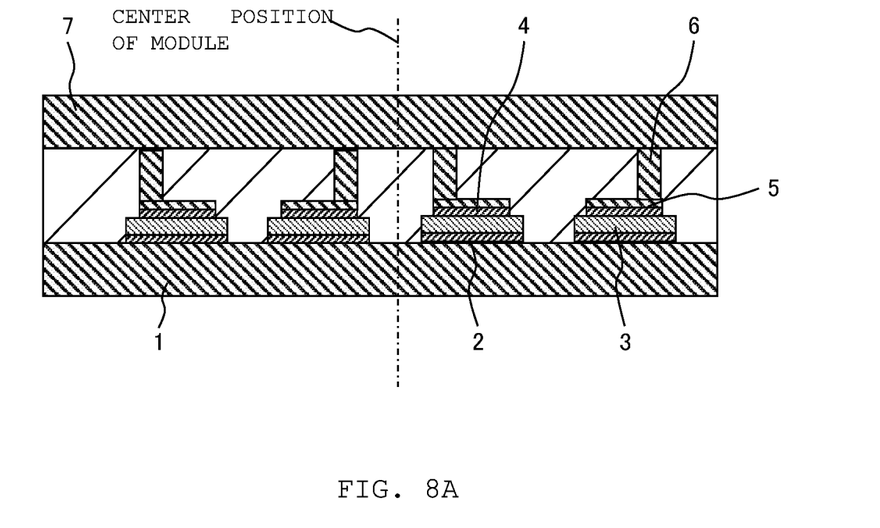
FIG. 8A is a cross-sectional view of a semiconductor module according to an embodiment of the invention.
Figure 8B:
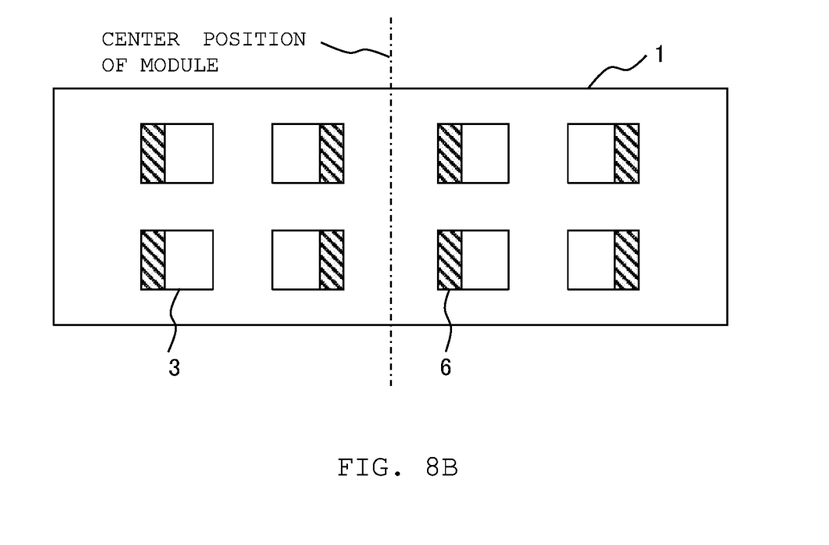
FIG. 8B is a plan view of the semiconductor module according to the embodiment of the invention.

As shown in FIGS. 8A and 8B, the second electrodes 6 are symmetrically disposed in the respective left and right regions of the center position of the module, so that the uneven distribution of the thermal strains in the semiconductor module is further reduced.

Further, a third electrode may be provided between the second electrode 6 and the second wiring layer 7, and a plurality of the second electrodes may be connected to the third electrode. In this case, the second electrode 6 and the third electrode may be connected via a fifth bonding layer, and the third electrode and the second wiring layer 7 may be connected via a sixth bonding layer.

It should be noted that the above embodiments have been specifically described to help understand the invention, and the invention is not limited to having all the described configurations. For example, a part of a configuration according to a certain embodiment may be replaced by a configuration according to another embodiment, and a configuration according to a certain embodiment may be added with a configuration according to another embodiment. Further, a part of a configuration according to each embodiment can be deleted or replaced by another configuration or added with another configuration.

REFERENCE SIGN LIST 1 first wiring layer
2 first bonding layer
3 semiconductor element
4 second bonding layer
5 first electrode
6 second electrode
7 second wiring layer
8 sealing member
9a, 9b insulating member
10a, 10b cooling member
11 spacer
50 electrode

The invention claimed is:

1. A semiconductor module comprising:
a first wiring layer;
a semiconductor element bonded to the first wiring layer via a first bonding layer;
a first electrode bonded to the semiconductor element via a second bonding layer;
a second electrode having an end portion connected to the first electrode, the end portion of the second electrode having a first dimension in a first direction and a second dimension in a second direction perpendicular to the first direction, the first dimension being less than the second dimension, the second electrode having a length in a third direction perpendicular to the first and second directions; and
a second wiring layer connected to the second electrode,
wherein the first dimension of the second electrode is greater than a thickness of the first electrode in the third direction, and
wherein the second electrode is disposed at a position spaced apart from a center position of the semiconductor element.

2. The semiconductor module according to claim 1, wherein the second electrode is a slit-shaped electrode.

3. The semiconductor module according to claim 2, further comprising another second electrode,
wherein both ends of the first electrode along the first direction are respectively connected to the second electrode and the another second electrode with the center position of the semiconductor element positioned between the both ends of the first electrode.

4. The semiconductor module according to claim 1,
wherein at least one of the first bonding layer and the second bonding layer is formed of sintered metal obtained by sintering metal particles.

5. The semiconductor module according to claim 1,
wherein the first electrode is a conductive member containing copper as a main component, and
wherein the second bonding layer is formed of sintered copper.

6. The semiconductor module according to claim 1,
wherein the first electrode and the second electrode are connected via a third bonding layer.

7. The semiconductor module according to claim 1,
wherein the first electrode and the second electrode are formed of an integral conductive member.

8. The semiconductor module according to claim 1,
wherein the second electrode and the second wiring layer are connected via a fourth bonding layer.

9. The semiconductor module according to claim 1,
wherein a plurality of semiconductor elements are disposed in one same semiconductor module.

10. The semiconductor module according to claim 9,
wherein the second electrode is provided so as to be line-symmetrical with the center position in a long-side direction of the semiconductor module as a symmetry axis.

11. The semiconductor module according to claim 10,
wherein in one of two regions separated by the symmetry axis, the second electrode is provided so as to be line-symmetrical with another adjacent second electrode in the long-side direction of the semiconductor module.

12. The semiconductor module according to claim 9,
wherein a third electrode is provided between the second electrode and the second wiring layer, and
wherein at least two or more second electrodes are connected to the third electrode.

13. The semiconductor module according to claim 12,
wherein the second electrode and the third electrode are connected via a fifth bonding layer.

14. The semiconductor module according to claim 13,
wherein the third electrode and the second wiring layer are connected via a sixth bonding layer.

15. A method for manufacturing a semiconductor module comprising:
(a) a step of bonding a semiconductor element to a first wiring layer via a first bonding layer;
(b) a step of bonding a first electrode to the semiconductor element via a second bonding layer;
(c) a step of disposing an end portion of a second electrode and a spacer on the first electrode, the end portion of the second electrode having a first dimension in a first direction and a second dimension in a second direction perpendicular to the first direction, the first dimension being less than the second dimension, the second electrode having a length in a third direction perpendicular to the first and second directions;
(d) a step of forming a second wiring layer on the second electrode and the spacer; and
(e) a step of applying pressure from above the second wiring layer,
wherein the first dimension of the second electrode is greater than a thickness of the first electrode in the third direction, and wherein the second electrode is disposed at a position spaced apart from a center position of the semiconductor element.

16. The method for manufacturing the semiconductor module according to claim 15, further comprising:
(f) a step of removing the spacer after step (e).

17. The method for manufacturing the semiconductor module according to claim 16,
wherein the second electrode and the spacer are formed of the same material.

18. The method for manufacturing the semiconductor module according to claim 15,
wherein the spacer is formed of the same material as a sealing member that seals a gap between the first wiring layer and the second wiring layer.

19. The method for manufacturing the semiconductor module according to claim 15,
wherein at least one of the first bonding layer and the second bonding layer is formed of sintered metal obtained by sintering metal particles.

20. A semiconductor module comprising:
a first wiring layer;
a semiconductor element bonded to the first wiring layer via a first bonding layer;
a first electrode bonded to the semiconductor element via a second bonding layer;
a plurality of second electrodes having first end portions connected to the first electrode, the first end portions of the second electrodes having first diameters and the second electrodes having lengths in a direction perpendicular to the first end portions of the second electrodes; and
a second wiring layer connected to the second electrode,
wherein the first diameters of the first end portions of the second electrodes are greater than a thickness of the first electrode in the direction perpendicular to the first end portions of the second electrodes, and
wherein the second electrodes are disposed at a position spaced apart from a center position of the semiconductor element.

\* \* \* \* \*